United States Patent
Lee et al.

(10) Patent No.: US 7,042,792 B2
(45) Date of Patent: May 9, 2006

(54) MULTI-PORT MEMORY CELLS FOR USE IN FIFO APPLICATIONS THAT SUPPORT DATA TRANSFERS BETWEEN CACHE AND SUPPLEMENTAL MEMORY ARRAYS

(75) Inventors: Shih-Ked Lee, Fremont, CA (US); Mario Au, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 35 days.

(21) Appl. No.: 10/930,966

(22) Filed: Aug. 31, 2004

(65) Prior Publication Data

US 2005/0152204 A1  Jul. 14, 2005

Related U.S. Application Data

(60) Provisional application No. 60/536,293, filed on Jan. 14, 2004.

(51) Int. Cl.
  *G11C 8/00* (2006.01)
(52) U.S. Cl. ............ 365/230.05; 365/221; 365/189.05; 365/154; 365/189.03; 71/131; 71/149; 71/104; 710/52
(58) Field of Classification Search ................ 365/221, 365/154, 189.05, 230.05, 189.03; 711/131, 711/149; 710/52
See application file for complete search history.

(56) References Cited

U.S. PATENT DOCUMENTS

| | | | |
|---|---|---|---|
| 4,195,340 A | 3/1980 | Joyce | 364/200 |
| 4,402,067 A | 8/1983 | Moss et al. | 365/219 |
| 4,577,293 A | 3/1986 | Matick et al. | 365/189 |
| 4,731,758 A | 3/1988 | Lam et al. | 365/189 |
| 4,758,987 A | 7/1988 | Sakui | 365/189 |
| 4,764,899 A * | 8/1988 | Lewallen et al. | 365/189.11 |
| 4,823,321 A | 4/1989 | Aoyama | 365/189 |
| 4,829,471 A | 5/1989 | Banerjee et al. | 364/900 |
| 4,837,746 A | 6/1989 | Banerjee et al. | 365/189.05 |
| 4,849,935 A | 7/1989 | Miyazawa | 365/189.05 |
| 4,888,741 A | 12/1989 | Malinowski | 365/230.05 |
| 4,894,770 A | 1/1990 | Ward et al. | 364/200 |
| 4,926,385 A | 5/1990 | Fujishima et al. | 365/230.03 |
| 5,025,421 A | 6/1991 | Cho | 365/230.05 |
| 5,027,326 A * | 6/1991 | Jones | 365/221 |
| 5,046,000 A | 9/1991 | Hsu | 364/200 |
| 5,226,009 A | 7/1993 | Arimoto | 365/189.04 |
| 5,226,147 A | 7/1993 | Fujishima et al. | 395/425 |
| 5,228,002 A | 7/1993 | Huang | 365/221 |
| 5,239,544 A * | 8/1993 | Balzano et al. | 370/465 |
| 5,249,282 A | 9/1993 | Segers | 395/425 |

(Continued)

*Primary Examiner*—Viet Q. Nguyen
(74) *Attorney, Agent, or Firm*—Myers Bigel Sibley & Sajovec

(57) ABSTRACT

A multi-port memory cell includes a first SRAM element having a first pair of access transistors electrically coupled to a pair of FIFO write bit lines. A second dual-port SRAM element is also provided. This second dual-port SRAM element has a second pair of access transistors electrically coupled to a pair of FIFO read bit lines and a third pair of access transistors electrically coupled to a pair of memory read bit lines. A direct path data transfer circuit is provided. This transfer circuit is configured to support a unidirectional data transfer path that extends from first storage nodes within the first SRAM element to second storage nodes within the second dual-port SRAM element. This transfer circuit is also responsive to a direct path word line signal.

8 Claims, 2 Drawing Sheets

U.S. PATENT DOCUMENTS

| | | | | |
|---|---|---|---|---|
| 5,269,009 A | 12/1993 | Herzl et al. | ............... | 395/425 |
| 5,276,842 A | 1/1994 | Sugita | ............... | 395/425 |
| 5,280,441 A | 1/1994 | Wada et al. | ............... | 365/63 |
| 5,289,432 A * | 2/1994 | Dhong et al. | ............... | 365/230.05 |
| 5,299,156 A * | 3/1994 | Jiang et al. | ............... | 365/154 |
| 5,365,485 A | 11/1994 | Ward et al. | ............... | 365/221 |
| 5,371,708 A | 12/1994 | Kobayashi | ............... | 365/221 |
| 5,371,877 A | 12/1994 | Drako et al. | ............... | 395/425 |
| 5,434,818 A | 7/1995 | Byers et al. | ............... | 365/189.04 |
| 5,442,747 A | 8/1995 | Chan et al. | ............... | 345/543 |
| 5,546,347 A | 8/1996 | Ko et al. | ............... | 365/221 |
| 5,557,733 A | 9/1996 | Hicok et al. | ............... | 395/162 |
| 5,561,781 A | 10/1996 | Braceras et al. | ............... | 395/458 |
| 5,586,299 A | 12/1996 | Wakerly | ............... | 711/149 |
| 5,603,009 A | 2/1997 | Konishi et al. | ............... | 395/492 |
| 5,627,326 A * | 5/1997 | Alesz et al. | ............... | 73/861.357 |
| 5,642,318 A | 6/1997 | Knaack et al. | ............... | 365/201 |
| 5,663,910 A | 9/1997 | Ko et al. | ............... | 365/189.05 |
| 5,671,393 A | 9/1997 | Yamaki et al. | ............... | 395/477 |
| 5,682,356 A | 10/1997 | Knaack | ............... | 365/236 |
| 5,712,820 A | 1/1998 | Knaack | ............... | 365/189.02 |
| 5,715,197 A | 2/1998 | Nance et al. | ............... | 365/189.04 |
| 5,732,041 A | 3/1998 | Joffe | ............... | 365/230.05 |
| 5,751,638 A | 5/1998 | Mick et al. | ............... | 365/189.04 |
| 5,764,967 A | 6/1998 | Knaack | ............... | 395/555 |
| 5,777,944 A | 7/1998 | Knaack et al. | ............... | 365/230.06 |
| 5,784,382 A | 7/1998 | Byers et al. | ............... | 371/22.3 |
| 5,829,015 A | 10/1998 | Macno | ............... | 365/230.05 |
| 5,829,026 A * | 10/1998 | Leung et al. | ............... | 711/122 |
| 5,852,608 A | 12/1998 | Csoppenszky et al. | ............... | 370/465 |
| 5,867,672 A | 2/1999 | Wang et al. | ............... | 710/307 |
| 5,883,826 A * | 3/1999 | Wendell et al. | ............... | 365/63 |
| 5,946,261 A | 8/1999 | Artieri | ............... | 365/230.05 |
| 5,956,748 A | 9/1999 | New | ............... | 711/149 |
| 5,973,985 A * | 10/1999 | Ferrant | ............... | 365/230.05 |
| 5,978,307 A | 11/1999 | Proebsting et al. | ............... | 365/230.05 |
| 5,982,700 A * | 11/1999 | Proebsting | ............... | 365/230.05 |
| 5,999,478 A | 12/1999 | Proebsting | ............... | 365/230.05 |
| 6,005,795 A * | 12/1999 | Hawkins et al. | ............... | 365/156 |
| 6,033,441 A * | 3/2000 | Herbert | ............... | 713/375 |
| 6,044,416 A | 3/2000 | Hasan | ............... | 710/52 |
| 6,075,745 A * | 6/2000 | Gould et al. | ............... | 365/230.03 |
| 6,075,931 A | 6/2000 | Panwar | ............... | 395/500.02 |
| 6,088,744 A | 7/2000 | Hill | ............... | 710/53 |
| 6,091,260 A | 7/2000 | Shamarao | ............... | 326/27 |
| 6,114,840 A | 9/2000 | Farrell et al. | ............... | 322/374 |
| 6,125,421 A * | 9/2000 | Roy | ............... | 711/5 |
| 6,147,926 A | 11/2000 | Park | ............... | 365/233 |
| 6,151,273 A | 11/2000 | Iwamoto et al. | ............... | 365/233 |
| 6,154,418 A | 11/2000 | Li | ............... | 365/233 |
| 6,154,419 A | 11/2000 | Shakkarwar | ............... | 365/235 |
| 6,172,927 B1 | 1/2001 | Taylor | ............... | 365/219 |
| 6,202,139 B1 | 3/2001 | Witt et al. | ............... | 711/169 |
| 6,211,695 B1 * | 4/2001 | Agrawal et al. | ............... | 326/40 |
| 6,216,205 B1 | 4/2001 | Chin et al. | ............... | 711/131 |
| 6,259,648 B1 | 7/2001 | Kragick | ............... | 365/230.05 |
| 6,259,652 B1 | 7/2001 | Heyne et al. | ............... | 365/700 |
| 6,263,410 B1 | 7/2001 | Kao et al. | ............... | 711/156 |
| 6,269,413 B1 | 7/2001 | Sherlock | ............... | 710/52 |
| 6,314,047 B1 * | 11/2001 | Keay et al. | ............... | 365/230.05 |
| 6,327,642 B1 | 12/2001 | Lee et al. | ............... | 711/120 |
| 6,330,636 B1 | 12/2001 | Bondurant et al. | ............... | 711/105 |
| 6,337,809 B1 | 1/2002 | Kim et al. | ............... | 365/189.05 |
| 6,337,830 B1 | 1/2002 | Faue | ............... | 365/230.04 |
| 6,339,558 B1 | 1/2002 | Ioki | ............... | 365/221 |
| 6,366,529 B1 | 4/2002 | Williams et al. | ............... | 365/239 |
| 6,381,194 B1 | 4/2002 | Li | ............... | 365/233 |
| 6,381,684 B1 | 4/2002 | Hronik et al. | ............... | 711/167 |
| 6,532,185 B1 | 3/2003 | Calvignac | ............... | 365/230.03 |
| 6,535,218 B1 * | 3/2003 | Schlapp | ............... | 345/545 |
| 6,538,957 B1 * | 3/2003 | Magoshi | ............... | 365/233 |
| 6,546,461 B1 * | 4/2003 | Au et al. | ............... | 711/131 |
| 6,557,053 B1 | 4/2003 | Bass | ............... | 710/29 |
| 6,754,777 B1 | 6/2004 | Au et al. | ............... | 711/131 |
| 6,765,408 B1 * | 7/2004 | Cheng et al. | ............... | 326/41 |
| 2004/0019743 A1 | 1/2004 | Au et al. | ............... | 711/131 |
| 2004/0047209 A1 | 3/2004 | Lien et al. | ............... | 365/202 |
| 2005/0005082 A1* | 1/2005 | Au et al. | ............... | 711/170 |

* cited by examiner

MULTI-PORT MEMORY CELLS FOR USE IN FIFO APPLICATIONS THAT SUPPORT DATA TRANSFERS BETWEEN CACHE AND SUPPLEMENTAL MEMORY ARRAYS

CLAIM TO PRIORITY APPLICATION

This application claims priority to U.S. Provisional Application Ser. No. 60/536,293, filed Jan. 14, 2004, the disclosure of which is hereby incorporated herein by reference.

FIELD OF THE INVENTION

The present invention relates to integrated circuit memory devices and methods of operating same, and more particularly to multi-port memory cells and memory cell layouts.

BACKGROUND OF THE INVENTION

Semiconductor memory devices can typically be classified on the basis of memory functionality, data access patterns and the nature of the data storage mechanism. For example, distinctions are typically made between read-only memory (ROM) devices and read-write memory (RWM) devices. The RWM devices typically have the advantage of offering both read and write functionality with comparable data access times. Typically, in RWM devices, data is stored either in flip-flops for "static" memory devices or as preset levels of charge on a capacitor in "dynamic" memory devices. As will be understood by those skilled in the art, static memory devices retain their data as long as a supply of power is maintained, however, dynamic memory devices require periodic data refreshing to compensate for potential charge leakage. Because RWM devices use active circuitry to store data, they belong to a class of memory devices known as "volatile" memory devices because data stored therein will be lost upon termination of the power supply. ROM devices, on the other hand, may encode data into circuit topology (e.g., by blowing fuses, removing diodes, etc.). Since this latter type of data storage may be hardwired, the data cannot be modified, but can only be read. ROM devices typically belong to a class of memory devices known as "nonvolatile" memory devices because data stored therein will typically not be lost upon termination of the power supply. Other types of memory devices that have been more recently developed are typically referred to as nonvolatile read-write (NVRWM) memory devices. These types of memory devices include EPROM (erasable programmable read-only memory), E²PROM (electrically erasable programmable read-only memory), and flash memories, for example.

An additional memory classification is typically based on the order in which data can be accessed. Here, most memory devices belong to the random-access class, which means that memory locations can be read from or written to in random order, typically by supplying a read or write address. Notwithstanding the fact that most memory devices provide random-access, typically only random-access RWM memories use the acronym RAM. Alternatively, memory devices may restrict the order of data access to achieve shorter data access times, reduce layout area and/or provide specialized functionality. Examples of such specialized memory devices include buffer memory devices such as first-in first-out (FIFO) memory devices, last-in first-out (LIFO or "stack") memory devices, shift registers and content addressable memory (CAM) devices.

A final classification of semiconductor memories is based on the number of input and output ports associated with the memory cells therein. For example, although most memory devices have unit cells therein that provide only a single port which is shared to provide an input and output path for the transfer of data, memory devices with higher bandwidth requirements often have cells therein with multiple input and output ports. However, the addition of ports to individual memory cells typically increases the complexity and layout area requirements for these higher bandwidth memory devices.

Single-port memory devices are typically made using static RAM cells if fast data access times are requiring, and dynamic RAM cells if low cost is a primary requirement. Many FIFO memory devices use dual-port RAM-based designs with self-incrementing internal read and write pointers to achieve fast fall-through capability. As will be understood by those skilled in the art, fall-through capability is typically measured as the time elapsing between the end of a write cycle into a previously empty FIFO and the time an operation to read that data may begin. Exemplary FIFO memory devices are more fully described and illustrated at section 2.2.7 of a textbook by A. K. Sharma entitled "Semiconductor Memories: Technology, Testing and Reliability", IEEE Press (1997).

In particular, dual-port SRAM-based FIFOs typically utilize separate read and write pointers to advantageously allow read and write operations to occur independently of each other and achieve fast fall-through capability since data written into a dual-port SRAM FIFO can be immediately accessed for reading. Since these read and write operations may occur independently, independent read and write clocks having different frequencies may be provided to enable the FIFO to act as a buffer between peripheral devices operating at different rates. Unfortunately, a major disadvantage of typical dual-port SRAM-based FIFOs is the relatively large unit cell size for each dual-port SRAM cell therein. Thus, for a given semiconductor chip size, dual-port buffer memory devices typically provide less memory capacity relative to single-port buffer memory devices. For example, using a standard DRAM cell as a reference unit cell consuming one (1) unit of area, a single-port SRAM unit cell typically may consume four (4) units of area and a dual-port SRAM unit cell typically may consume sixteen (16) units of area. Moreover, the relatively large unit cells of a dual-port SRAM FIFO may limit the degree to which the number of write operations can exceed the number of read operations, that is, limit the capacity of the FIFO.

To address these limitations of dual-port buffer memory devices, single-port buffer memory devices have been developed to, among other things, achieve higher data capacities for a given semiconductor chip size. For example, U.S. Pat. No. 5,546,347 to Ko et al. entitled "Interleaving Architecture And Method For A High Density FIFO", assigned to the present assignee, discloses a memory device which has high capacity and uses relatively small single-port memory cells. However, the use of only single port memory cells typically precludes simultaneous read and write access to data in the same memory cell, which means that single-port buffer memory devices typically have slower fall-through time than comparable dual-port memory devices. Moreover, single-port buffer memory devices may use complicated arbitration hardware to control sequencing and queuing of reading and writing operations.

U.S. Pat. No. 5,371,708 to Kobayashi also discloses a FIFO memory device containing a single-port memory array, a read data register for holding read data from the memory array and a write data register for holding write data to the memory array. A bypass switch is provided for transferring data from the write data register to the read data register so that the memory array can be bypassed during testing of the FIFO to detect the presence of defects therein. However, like the above-described single-port buffer memory devices, simultaneous read and write access to data is not feasible.

Commonly assigned U.S. Pat. Nos. 5,978,307, 5,982,700 and 5,999,478 disclose memory buffers having fast fall-through capability. These memory buffers contain a tri-port memory array of moderate capacity having nonlinear columns of tri-port cells therein which collectively form four separate registers, and a substantially larger capacity supplemental memory array (e.g., DRAM array) having cells therein with reduced unit cell size. The tri-port memory array has a read port, a write port and a bidirectional input/output port. The tri-port memory array communicates internally with the supplemental memory array via the bidirectional input/output port and communicates with external devices (e.g., peripheral devices) via the read and write data ports. Efficient steering circuitry is also provided by a bidirectional crosspoint switch that electrically couples terminals (lines IO and IOB) of the bidirectional input/output port in parallel to bit lines (BL and BLB) in the supplemental memory array during a write-to-memory time interval and vice versa during a read-from-memory time interval.

Commonly assigned U.S. Pat. Nos. 6,546,461 and 6,754,777 also disclose FIFO memory devices that use multiple multi-port caches to support high rate reading operations. These multi-port caches may use quad-port bit cells containing 42 transistors/cell. These multi-port caches may also be coupled to supplemental memories to provide high capacity FIFO memory devices. The supplemental memories may be memories that are embedded with the cache on the same semiconductor substrate, however, external supplemental memories may also be used. Examples of FIFO memory devices that utilize multi-port caches and external memories are illustrated in U.S. Patent Publication Nos. 2004/0019743 and 2004/0047209.

SUMMARY OF THE INVENTION

Embodiments of the present invention include a quad-port memory cell, which may be used as a cache memory bit cell in such devices as first-in first-out (FIFO) memories and other types of sequential flow control devices. The quad-port memory cell includes a pair of dual-port SRAM elements and a data transfer circuit. A first dual-port SRAM element is defined by two pairs of access transistors and a latch element, which may include a pair of inverters connected in antiparallel. The output terminals of these inverters represent complementary storage nodes. A second dual-port SRAM element is also defined by two pairs of access transistors and a latch element.

The first dual-port SRAM element may undergo a write operation by driving a pair of bit lines FWBL and /FWBL with FIFO write data and turning on a pair of access transistors by driving a FIFO WRITE word line to an active high level. The second dual-port SRAM element may undergo a write operation by driving a pair of bit lines MRBL and /MRBL with MEMORY READ data and turning on a pair of access transistors by driving a MEMORY READ word line to an active high level.

During an operation to transfer FIFO write data from a cache memory, containing an array of the quad-port memory cells, to a supplemental memory device (e.g., embedded memory or off-chip memory (e.g., DRAM chip)), a MEMORY WRITE word line is driven to an active high level. This operates to transfer write data from the first dual-port SRAM element to a pair of bit lines MWBL and /MWBL. An operation to read FIFO data from the quad-port memory cell may be performed by driving a FIFO READ word line to an active high level to thereby turn on a pair of access transistors. This operates to transfer FIFO read data to a pair of bit lines FRBL and /FRBL.

The memory cell also includes a pair of pass transistors and a pull-down transistor. These transistors define a unidirectional data transfer circuit, which may be used in preferred embodiments to transfer FIFO write data directly from the latch element in the first dual-port SRAM element to the latch element in the second dual-port SRAM element, where it is then available for reading. This data transfer operation may be performed by driving a DIRECT PATH word line to an active high level to thereby turn on the pull-down transistor in the data transfer circuit.

DESCRIPTION OF PREFERRED EMBODIMENTS

Figure 1:
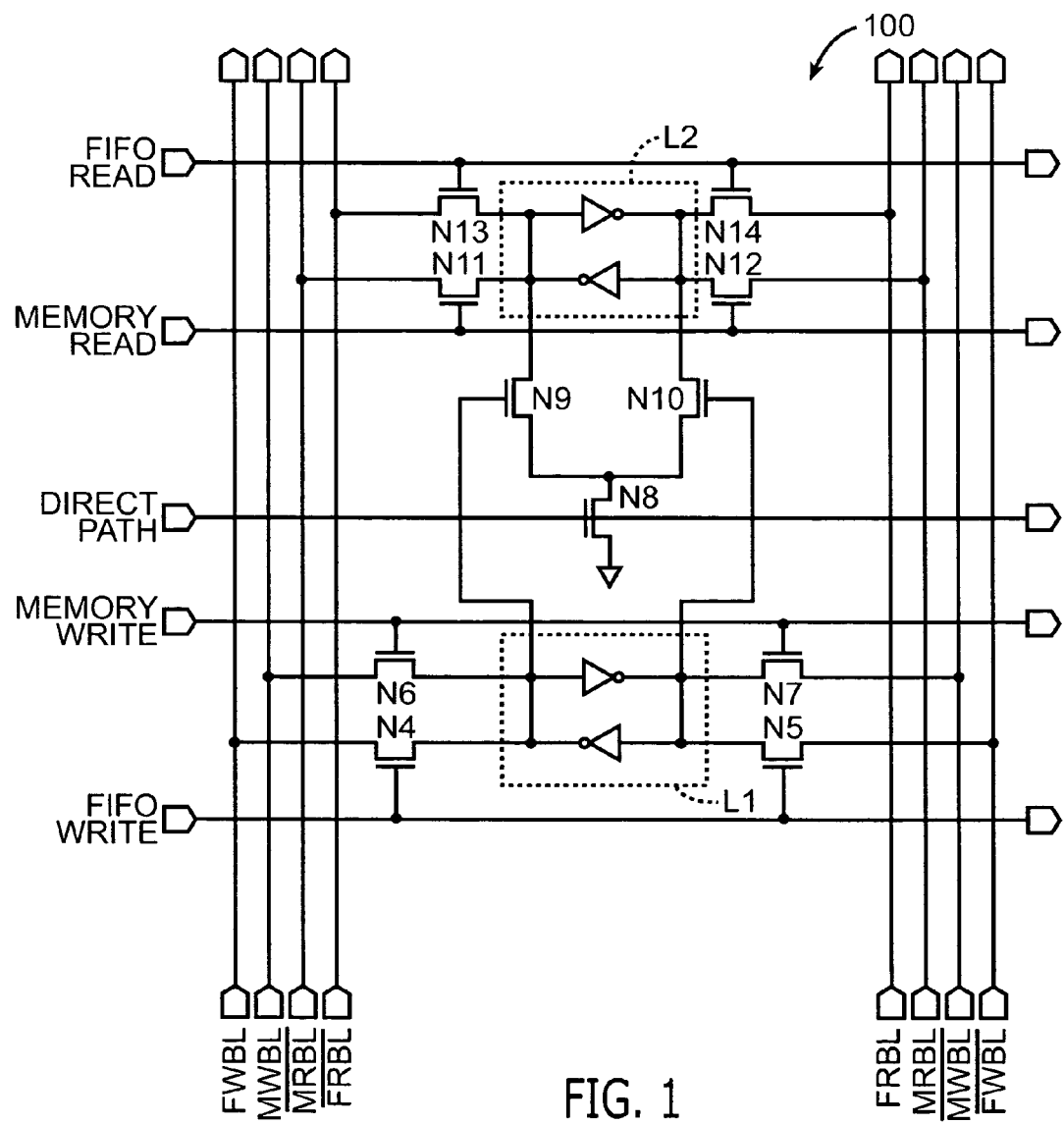
FIG. 1 is an electrical schematic of a quad-port memory cell according to embodiments of the present invention.

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. When added as a prefix, the symbol "/" designates a complementary data or information signal or an active low control signal, for example.

Embodiments of the present invention may be used as cache memory bit cells in such devices as first-in first-out (FIFO) memories and other sequential flow control devices. An exemplary sequential flow control device is described in commonly assigned U.S. application Ser. No. 10/912,938, filed Aug. 6, 2004, the disclosure of which is hereby incorporated herein by reference. Referring now to FIG. 1, a quad-port memory cell 100 is illustrated as including 19 transistors that define two dual-port SRAM elements and a data transfer circuit. This quad-port memory cell 100 may be used as a replacement for the QPCACHE bit cell 30a illustrated and described in commonly assigned U.S. Pat. Nos. 6,546,461 and 6,754,777 and U.S. Patent Publication Nos. 2004/0019743 and 2004/0047209, the disclosures of which are hereby incorporated herein by reference. Smaller cell designs that do not rely on SRAM technology (e.g., DRAM cell designs) may also be used in alternative embodiments of the invention.

The first dual-port SRAM element is defined by NMOS access transistors N4–N7 and latch element L1, which includes a pair of inverters connected in antiparallel. The output terminals of these inverters represent complementary storage nodes within the first dual-port SRAM element. The second dual-port SRAM element is defined by NMOS access transistors N11–N14 and latch element L2, which includes another pair of inverters connected in antiparallel.

The first dual-port SRAM element may undergo a write operation by driving a pair of FIFO write lines FWBL and /FWBL with FIFO write data and turning on the NMOS access transistors N4–N5 by driving a FIFO WRITE word line to an active high level. The second dual-port SRAM element may undergo a write operation by driving a pair of memory read bit lines MRBL and /MRBL with memory read data and turning on the NMOS access transistors N11–N12 by driving a MEMORY READ word line to an active high level.

During an operation to transfer FIFO write data from a quad-port cache memory, which contains at least one array of the memory cells 100, to a supplemental memory device (e.g., embedded memory or off-chip memory (e.g., DRAM chip)), the MEMORY WRITE word line is driven to an active high level. This transfers write data from the storage nodes within the first dual-port SRAM element to the memory write bit lines MWBL and /MWBL. Finally, an operation to read FIFO data from the memory cell 100 may be performed by driving a FIFO READ word line to an active high level to thereby turn on the NMOS access transistors N13–N14. This results in a transfer of FIFO read data from the storage nodes within the second dual-port SRAM element to the FIFO read bit lines FRBL and /FRBL.

The memory cell 100 of FIG. 1 also includes a pair of NMOS pass transistors N9 and N10 and an NMOS pull-down transistor N8. These transistors N8–N10 define a unidirectional data transfer circuit. This data transfer circuit may be used to transfer FIFO write data directly from the latch element L1 in the first dual-port SRAM element to the latch element L2 in the second dual-port SRAM element, where it is then immediately available for reading from a FIFO memory device containing the quad-port memory cell 100. This transfer operation may be performed by driving a DIRECT PATH word line to an active high level to thereby turn on the NMOS pull-down transistor N8. As described more fully in the aforementioned '461 and '777 patents, driving the DIRECT PATH word line to an active high level typically occurs when a FIFO memory device is at a near empty condition. To avoid any data conflict between the two latch elements L1 and L2, the MEMORY READ word line the DIRECT PATH word line may not be active at the same time.

Accordingly, the memory cell 100 of FIG. 1 includes a first SRAM element having a first pair of access transistors N4–N5 that are electrically coupled to a pair of FIFO write bit lines FWBL and /FWBL. A second dual-port SRAM element is also provided. This second dual-port SRAM element includes a second pair of access transistors N13–N14, which are electrically coupled to a pair of FIFO read bit lines FRBL and /FRBL, and a third pair of access transistors N11–N12, which are electrically coupled to a pair of memory read bit lines MRBL and /MRBL. A data transfer circuit is also provided by NMOS transistors N8–N10. This data transfer circuit supports a unidirectional data transfer path, which extends from the storage nodes within the first SRAM element (outputs of latch element L1) to the storage nodes within the second dual-port SRAM element (outputs of latch element L2). This unidirectional data transfer path is enabled when the DIRECT PATH word line signal is driven to an active high level and the NMOS pull-down transistor N8 is turned on. In particular, when the DIRECT PATH word line signal is driven to an active high level, one of the storage nodes within the first SRAM element operates to turn on either NMOS pass transistor N9 or NMOS pass transistor N10. This causes one of the storage nodes within the second SRAM element to be pulled (or held) low and the other storage node to be driven (or held) high.

For layout convenience, the memory cell 100 of FIG. 1 may be modified by substituting a pair of NMOS pull-down transistors for the illustrated NMOS pull-down transistor N8. Moreover, because operations to write data into the multi-port cache during FIFO write operations typically do not conflict with cache-to-memory data transfer operations, the MEMORY WRITE word line, NMOS access transistors N6–N7 and memory write bit lines MWBL and /MWBL may be omitted in some embodiments of the memory cell. In this case, the FIFO write word line and the FIFO WRITE bit lines FWBL and /FWBL are used during operations to write FIFO data into the multi-port cache and also when transferring this write data to the supplemental memory. Removal of the NMOS access transistors N6–N7 reduces the transistor count to 17 transistors per bit cell, or possibly 18 transistors if a pair of NMOS pull-down transistors are used to replace the single NMOS pull-down transistor within the data transfer circuit.

Figure 2:
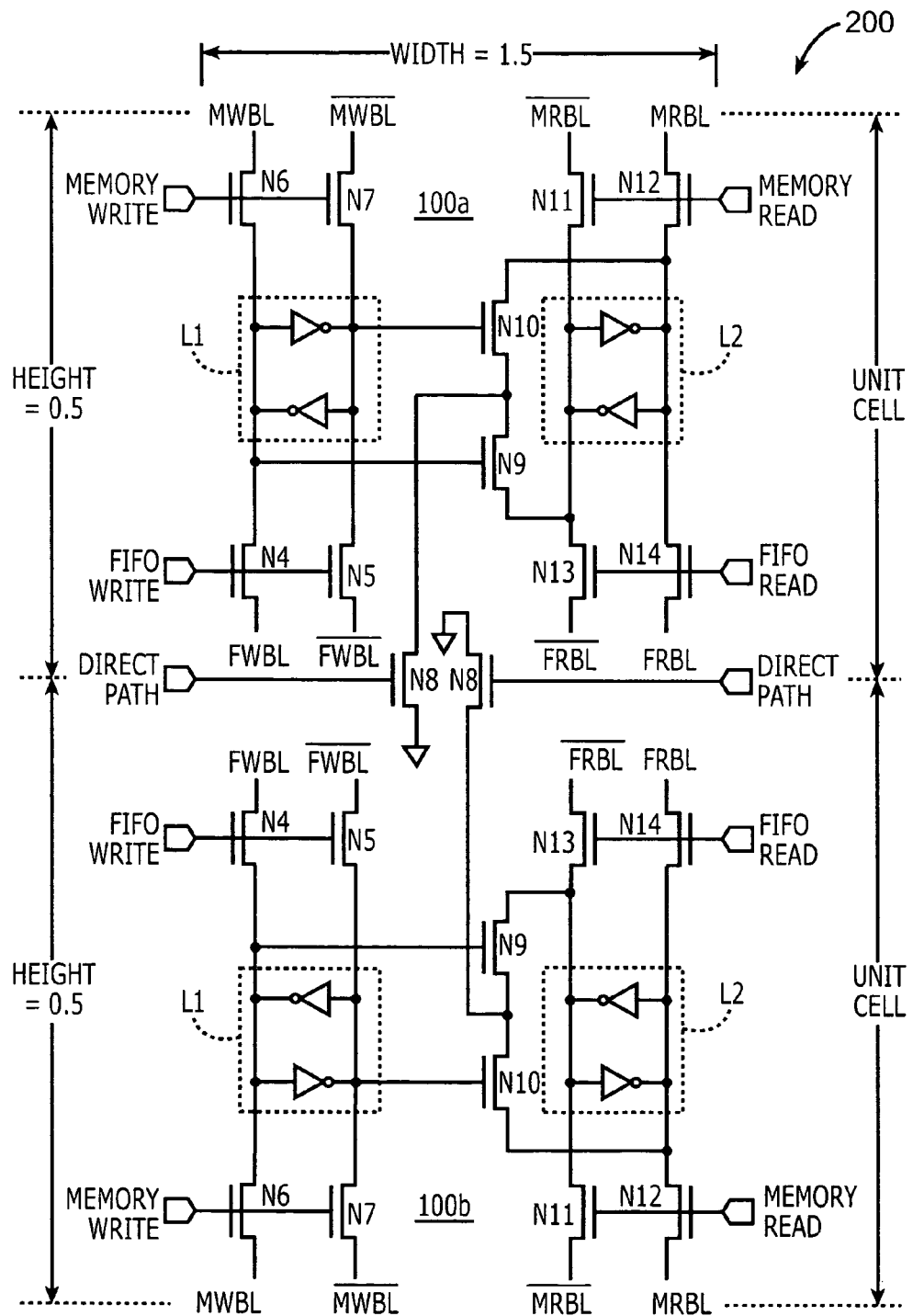
FIG. 2 is an electrical schematic that illustrates a layout arrangement of a pair of quad-port memory cells according to embodiments of the present invention.

FIG. 2 is an electrical schematic of a layout footprint of a pair of quad-port memory cells 200 in a semiconductor substrate, according to an embodiment of the present invention. This pair of quad-port memory cells 200 includes a first quad-port memory cell 100a disposed in a first half of the layout footprint (shown as the upper half) and a second quad-port memory cell 100b disposed in a second half of the layout footprint (shown as the lower half). As illustrated, the pair of quad-port memory cells 200, which are arranged as substantially mirror images of each other in a semiconductor substrate, have a substantially rectangular layout footprint when formed in a semiconductor substrate. According to a preferred aspect of this embodiment, the discrete transistors within each cell are disposed and oriented relative to each other to achieve a width/height aspect ratio in a range from about 1.0 to about 2.0 and, more preferably, in a range from about 1.4 to about 1.6 to achieve high layout integration. In the illustrated embodiment of FIG. 2, the width/height aspect ratio is about 1.5.

The first quad-port cache memory cell 100a includes a first dual-port SRAM element. The first dual-port SRAM element includes a first pair of access transistors N4 and N5 electrically coupled to a pair of FIFO write bit lines (FWBL, /FWBL), a second pair of access transistors N6 and N7 electrically coupled to a pair of memory write bit lines (MWBL, /MWBL) and a latch element (L1). The latch element L1 is illustrated as a pair of inverters connected in antiparallel, with each inverter output connected to a corresponding storage node. The first quad-port cache memory cell 100a also includes a second dual-port SRAM element. The second dual-port SRAM element includes a third pair of access transistors N13 and N14 electrically coupled to a pair of FIFO read bit lines (FRBL, /FRBL), a fourth pair of access transistors N11 and N12 electrically coupled to a pair of memory read bit lines (MRBL, /MRBL) and a latch element (L2). The latch element L2 is illustrated as a pair of inverters connected in antiparallel, with each inverter output connected to a corresponding storage node.

A data transfer circuit is also provided between the first and second dual-port SRAM elements. This data transfer circuit is responsive to a direct path word line signal (DIRECT PATH). As illustrated, the data transfer circuit is configured to support a unidirectional data transfer path extending from first storage nodes (i.e., nodes of L1) within the first dual-port SRAM element to second storage nodes (i.e., nodes of L2) within the second dual-port SRAM element. This data transfer circuit includes a pair of pass transistors N9 and N10. The gate terminals of the pass transistors N9 and N10 are electrically connected to corresponding ones of the first storage nodes (nodes of L1). First current carrying terminals of the pass transistors N9 and N10 are electrically connected to corresponding ones of the second storage nodes (nodes of L2). A pull-down transistor N8 is also provided. The pull-down transistor has a current carrying terminal (e.g., drain terminal) electrically connected to second current carrying terminals (e.g., source terminals) of the pair of pass transistors N9 and N10 and a gate terminal responsive to the direct path word line signal (DIRECT PATH).

Finally, as illustrated by the lower half of the layout footprint illustrated by FIG. 2, the elements within the second quad-port cache memory cell 100b are oriented as mirror images of the corresponding elements within the first quad-port cache memory cell 100a, when rotated about a horizontal axis extending from left-to-right across FIG. 2. In particular, only the pair of pull-down transistors N8 in the center of the layout footprint are horizontally offset somewhat to prevent overlap.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A multi-port memory cell, comprising:
    a first SRAM element having a first pair of access transistors electrically coupled to a pair of FIFO write bit lines;
    a second dual-port SRAM element having a second pair of access transistors electrically coupled to a pair of FIFO read bit lines and a third pair of access transistors electrically coupled to a pair of memory read bit lines; and
    a data transfer circuit responsive to a direct path word line signal, said data transfer circuit configured to support a unidirectional data transfer path extending from first storage nodes within said first SRAM element to second storage nodes within said second dual-port SRAM element.

2. The memory cell of claim 1, where said data transfer circuit comprises:
    a pair of pass transistors having gate terminals electrically connected to corresponding ones of the first storage nodes and first current carrying terminals electrically connected to corresponding ones of the second storage nodes; and a pull-down transistor having a current carrying terminal electrically connected to second current carrying terminals of said pair of pass transistors and a gate terminal responsive to the direct path word line signal.

3. The memory cell of claim 1, where said first SRAM element comprises a dual-port SRAM element having a fourth pair of access transistors electrically coupled to a pair of memory write bit lines.

4. The memory cell of claim 3, where said data transfer circuit comprises:
    a pair of pass transistors having gate terminals electrically connected to corresponding ones of the first storage nodes and first current carrying terminals electrically connected to corresponding ones of the second storage nodes; and
    a pull-down transistor having a current carrying terminal electrically connected to second current carrying terminals of said pair of pass transistors and a gate terminal responsive to the direct path word line signal.

5. A quad-port cache memory cell, comprising:
    a first dual-port SRAM element having a first pair of access transistors electrically coupled to a pair of FIFO write bit lines and a second pair of access transistors electrically coupled to a pair of memory write bit lines;
    a second dual-port SRAM element having a third pair of access transistors electrically coupled to a pair of FIFO read bit lines and a fourth pair of access transistors electrically coupled to a pair of memory read bit lines; and
    a data transfer circuit disposed between said first dual-port SRAM element and said second dual-port SRAM element, said data transfer circuit responsive to a direct path word line signal and configured to support a unidirectional data transfer path extending from first storage nodes within said first dual-port SRAM element to second storage nodes within said second dual-port SRAM element.

6. The memory cell of claim 5, where said data transfer circuit comprises:
    a pair of pass transistors having gate terminals electrically connected to corresponding ones of the first storage nodes and first current carrying terminals electrically connected to corresponding ones of the second storage nodes; and
    a pull-down transistor having a current carrying terminal electrically connected to second current carrying terminals of said pair of pass transistors and a gate terminal responsive to the direct path word line signal.

7. A multi-port cache memory cell, comprising:
    a first dual-port memory element having a first pair of access transistors electrically coupled to a pair of FIFO write bit lines and a second pair of access transistors electrically coupled to a pair of memory write bit lines;
    a second dual-port memory element having a third pair of access transistors electrically coupled to a pair of FIFO read bit lines and a fourth pair of access transistors electrically coupled to a pair of memory read bit lines; and
    a data transfer circuit disposed between said first dual-port memory element and said second dual-port memory element, said data transfer circuit responsive to a direct path word line signal and configured to support a unidirectional data transfer path extending from first storage nodes within said first dual-port memory element to second storage nodes within said second dual-port memory element.

8. The memory cell of claim 7, where said data transfer circuit comprises:
    a pair of pass transistors having gate terminals electrically connected to corresponding ones of the first storage nodes and first current carrying terminals electrically connected to corresponding ones of the second storage nodes; and
    a pull-down transistor having a current carrying terminal electrically connected to second current carrying terminals of said pair of pass transistors and a gate terminal responsive to the direct path word line signal.

* * * * *